United States Patent
Kuwabara

(12) 
(10) Patent No.: US 6,455,832 B1
(45) Date of Patent: Sep. 24, 2002

(54) DEFECT DISCRIMINATING METHOD AND DEVICE FOR SOLID-STATE DETECTOR

(75) Inventor: Takao Kuwabara, Kaisei-machi (JP)

(73) Assignee: Fuji Photo Film Co., Ltd., Kanagawa-Ken (JP)

(*) Notice: Subject to any disclaimer, the term of this patent is extended or adjusted under 35 U.S.C. 154(b) by 0 days.

(21) Appl. No.: 09/472,953

(22) Filed: Dec. 27, 1999

(30) Foreign Application Priority Data

Dec. 25, 1998 (JP) .......................................... 10-370895

(51) Int. Cl.[7] .............................................. H01L 27/00
(52) U.S. Cl. .............................. 250/208.1; 250/559.45; 382/168
(58) Field of Search ..................... 250/559.45, 559.4, 250/208.1, 214 R, 214.1; 382/168, 169, 170, 171

(56) References Cited

U.S. PATENT DOCUMENTS

| | | | |
|---|---|---|---|
| 4,803,359 A | 2/1989 | Hosoi et al. | 250/327.2 |
| 5,187,369 A | 2/1993 | Kingsley | 250/370.11 |
| 5,832,055 A | 11/1998 | Dewaele | 378/62 |
| 5,995,675 A * | 11/1999 | Hwang | 382/268 |
| 6,087,673 A * | 7/2000 | Shishido et al. | 250/559.45 |

FOREIGN PATENT DOCUMENTS

| | | | | |
|---|---|---|---|---|
| JP | 59-211263 | | 11/1984 | H01L/27/14 |
| JP | 1-216290 | | 8/1989 | G01T/1/24 |
| JP | 2-164067 | | 6/1990 | H01L/27/146 |
| JP | 10-133309 | | 5/1998 | G03B/42/02 |
| JP | 10-232824 | * | 9/1998 | |
| WO | 92/06501 | | 4/1992 | H01L/27/14 |

OTHER PUBLICATIONS

Antonuk, L.E. et al, "Signal, Noise, and Readout Considerations in the Development of Amorphous Silicon Photodiode Arrays for Radiotherapy and Diagnostic X-ray Imaging", SPIE vol. 1443, Medical Imaging V, Image Physics (1991), pp 108–119.

Qureshi, S. et al, "Material Parameters in Thick Hydorgenated Amorphous Silicon Radiation Detectors", Lawrence Berkeley Laboratory, University of California.

Naruse, Y., "Metal/Amorphous Silicon Multilayer Radiation Detectors", IEE Transactions on Nuclear Science, vol. 36, No. 2, Apr. 1989.

* cited by examiner

*Primary Examiner*—Stephone Allen
*Assistant Examiner*—Eric Spears
(74) *Attorney, Agent, or Firm*—Sughrue Mion, PLLC

(57) ABSTRACT

Histogram preparation means 22 prepares a histogram of the image data D (p, i) of each detecting element which is read out in the dark (bright) state. With respect to the data value Dmax at which the maximum frequency in the histogram, Hmax, is provided, defect discrimination value determination means 23 determines the lower defect discrimination value $D_{c1}$ and the upper defect discrimination value $D_{c2}$ at which the frequency in the histogram first comes down to or below the specified frequency (0, for example), starting from the maximum frequency Hmax. Discrimination means 24 takes the ranges under the lower defect discrimination value $D_{c1}$ and over the upper defect discrimination value $D_{c2}$ as the defective ranges, and discriminates all the detecting elements outputting a detection signal in such a defective range as defective elements in the dark (bright) state.

20 Claims, 4 Drawing Sheets

| D (0, 0) | D (0, 1) | D (0, 2) | | D (0, N-X) | D N-(0, (X-1)) | ---- | D (0, N) |
|---|---|---|---|---|---|---|---|
| D (1, 0) | D (1, 1) | D (1, 2) | | D (1, N-X) | D N-(1, (X-1)) | ---- | D (1, N) |
| ⋮ | ⋮ | ⋮ | | ⋮ | ⋮ | | ⋮ |
| D (M, 0) | D (M, 1) | D (M, 2) | | D (M, N-X) | D N-(M, (X-1)) | ---- | D (M, N) |

FIG.2

DEFECT DISCRIMINATING METHOD AND DEVICE FOR SOLID-STATE DETECTOR

BACKGROUND OF THE INVENTION

1. Field of the Invention

The present invention relates to a method and device for discriminating defects of detecting elements constituting a solid-state detector, and more specifically, to a defect discriminating method and a defect discriminating device for discriminating the defective elements among a number of detecting elements constituting a solid-state image sensor, such as a CCD image sensor which detects visible light and outputs an image signal, and a radiation solid-state detector or the like which detects radiation and outputs an image signal.

2. Description of the Prior Art

Up to now, solid-state image sensors such as a CCD image sensor which detects visible light and outputs an image signal have been widely used in such applications as video cameras and digital still cameras. This solid-state image sensor comprises a number of photoelectric transducers arranged in the form of a matrix (for color applications, a color filter is further overlaid upon each photoelectric transducer), outputting an image signal carrying visible image information as two-dimensional matrix information.

Nowadays, in the field of radiation photographing for medical diagnosis, a variety of radiation solid-state detectors which detect radiation and output an image signal (mainly consisting of semiconductors) have been proposed and put to practical use. As a typical one of the various types of radiation solid-state detectors proposed, the radiation solid-state detector of photoelectric conversion type, which reads out the stored charges (also called the "latent image charges") carrying image information by means of thin film transistors (TFTs) (Japanese Unexamined Patent Publication No. 59 (1984)-211263, Japanese Unexamined Patent Publication No. 2 (1990)-164067, PCT International Publication No. WO92/06501, SPIE Vol. 1443 Medical Imaging V; Image Physics (1991), p. 108-119, etc.), the radiation solid-state detector of direct conversion type (MATERIAL PARAMETERS IN THICK HYDROGENATED AMORPHOUS SILICON RADIATION DETECTORS, Lawrence Berkeley Laboratory. University of California, Berkeley. Calif. 94720 Xerox Parc. Palo Alto. CA 94304, Metal/Amorphous Silicon Multilayer Radiation Detectors, IEE TRANSACTIONS ON NUCLEAR SCIENCE. VOL. 36. NO. 2. APRIL 1989, Japanese Unexamined Patent Application No. 1 (1989)-216290, etc.), and the radiation solid-state detector of improved direct conversion type, a mode of direct conversion type, (also called "light reading type"), in which the reading light is projected for scanning and reading out the latent image charges, are available.

Here, with the radiation solid-state detector of improved direct conversion type, a mode of direct conversion type, i.e., a mode in which the electromagnetic radiation (for example, visible light) for reading is projected for scanning and reading out, which has been proposed in Japanese Patent Application No. 10 (1998)-232824 by the present applicant, a first conductor layer having a permeability to radiation for recording, a photoconductive. layer for recording which exhibits a photoconductive phenomenon (exactly a radiation-conductive one), when irradiated with the radiation for recording which has penetrated through the first photoconductive layer, a charge transporting layer which acts almost as an insulator for a charge having the same polarity as that of the charges provided in the first conductor layer, while acting roughly as a conductor for a charge having a polarity opposite to that of the charges, a photoconductive layer for reading which exhibits a photoconductive phenomenon (exactly an electromagnetic radiation-conductive phenomenon), when irradiated with radiation for reading, and a second conductor layer having a permeability to electoromagnetic radiation for reading, are stacked together in this order, and the latent image charges carrying image information are stored on the boundary surface between the recording photoconductive layer and the charge transporting layer. The first conductor layer and the second conductor layer each act as an electrode. With this mode, the detecting element mainly consists of a photoconductive layer for recording, a charge transporting layer, and a photoconductive layer for reading.

With this improved direct conversion type of radiation solid-state detector, as modes in which the electrostatic latent image carried by the latent image charges are read out, the mode in which the second conductor layer (hereafter called the "reading electrode") is formed in a flat sheet, and this reading electrode is scanned with a spot-like beam of a laser or other type of reading light to detect the latent image charges, and the mode in which the reading electrode is provided as stripy electrodes, and the line light sources extending in the direction approximately perpendicular to the longitudinal direction of the stripy electrodes are scanned along the longitudinal direction of the stripy electrodes to detect the latent image charges, are available. With the radiation solid-state detector, whichever reading mode it adopts, it provides a two-dimensional radiation solid-state detector in which a plurality of detecting elements, each of which corresponds to a pixel, are arranged practically in the form of a matrix. The word "practically" is used in the above statement because it cannot be said that, with the detector itself, the individual detecting elements are arranged in the form of amatrix. However, in the process in which an image signal obtained by reading out the latent charges is processed, a sampling point corresponds to a pixel, for example. With a radiation solid-state detector in which the reading electrode is provided as stripy electrodes, the stripy electrodes define the pixel points for the direction of arrangement.

With any one of the above-mentioned various types of radiation solid-state detectors, the solid-state detecting elements are arranged in the form of a matrix, and an image signal carrying a radiation image is output as two-dimensional matrix information.

Hereinbelow, a solid-state image sensor which detects visible light and outputs an image signal carrying visible image information, and a radiation solid-state detector which detects radiation and outputs an image signal carrying radiation image information are collectively referred to as "solid-state detectors". This solid-state detector may not only be two-dimensional, but also one-dimensional.

A variety of elements, such as the photoelectric transducer constituting a solid-state image sensor, and the solid-state detecting elements constituting a radiation solid-state detector (described later) are collectively called "detecting elements".

Incidentally, with the above-stated solid-state detector, adherence of dirt during manufacturing, occurrence of scratches in service, etc. may cause a so-called pixel defect, in other words, a phenomenon in which a detection signal is not normally outputted from a specific detecting element of the detecting elements constituting the solid-state detector.

As stated above, this pixel defect is caused by dirt, etc., and is so fine that it is extremely difficult to see by visual inspection. Therefore, a variety of methods which use the digital image processing technology to carry out automatic discrimination of the image defect have been proposed (for example, Japanese Unexamined Patent Publication No. 10 (1998)-133309).

With the defect discriminating method as given in this citation, a flat field image is read out while the recording member (equivalent to the solid-state detector as mentioned in the present specification) is exposed to flat field light, a smooth background image is generated, by removing a value corresponding to it from the pixel value of the flat field image, a residual image is obtained (equivalent to passing through a low-pass filter), and when comparison of the threshold value defined by the dispersion of the noise distribution with the absolute value of the residual image indicates that the absolute value of the residual image is greater than the threshold value, the pixel is discriminated as defective.

However, the above defect discriminating method compares the threshold value ($3\sigma$ to $5\sigma$) defined by the dispersion of the noise distribution with the absolute value of the residual image, and therefore a problem where a normal pixel, if beyond the threshold value ($3\sigma$ to $5\sigma$), is discriminated as a defective one arises. For example, when the residual image is in the range of variation rather than due to dirt or the like, the pixel is discriminated as a defective pixel regardless of the fact that it is normal. In addition, a problem arises where, because complicated arithmetic processing is required to obtain the residual image, the process is cumbersome.

SUMMARY OF INVENTION

The first defect discriminating method according to the present invention is a defect discriminating method which discriminates a defective element of a solid-state detector with which a number of detecting elements to detect visible light or radiation are arranged, in which a histogram of each detection signal outputted from the detecting elements in the dark state and/or a histogram of each detection signal outputted from the detecting elements in the bright state in which a definite quantity of light or radiation is projected on to the detecting elements without being passed through a subject are/is acquired, a representative value of the detection signals outputted from said detecting elements which are considered to be normal is determined, the value of the detecting signal at which the frequency in said histogram first comes down to or below a specified frequency, starting from the frequency of said representative value, is taken as the defect discrimination value, and a detecting element among the detecting elements which outputs a detection signal beyond the defect discrimination value is discriminated as a defective element.

The "dark state" includes either the state in which visible light or radiation is not projected at all or the state in which a definite and extremely small quantity of visible light or radiation is projected on each detecting element without being passed through a subject. Needless to say, the definite quantity of light in the bright state is greater than that in the dark state.

The "detecting elements in the dark state" means a detector with which radiation image information is recorded in the dark state, i.e., the detecting elements constituting a detector with which radiation image information is practically not recorded, and the "detecting elements in the bright state" means a detector with which radiation image information is recorded in the bright state, i.e., the detecting elements constituting a detector with which a piece of radiation image information is recorded. Needless to say, both detectors mentioned above are the same detector.

In the first defect discriminating method, it is desirable to determine the defect discrimination value which takes the variation in sensitivity of the detecting elements into consideration by determining the "specified frequency" according to an index which indicates the sensitivity of said detecting elements. Here, "the variation in sensitivity of the detecting elements" means variation in the output level of the detecting elements caused by gain variation or offset in the conversion gain of the detecting elements or in the output gain of the output amplifier for reading out electric charges. The "index indicating the sensitivity of the detecting elements" is an index or character which is capable of indicating said "variation in sensitivity of the detecting elements". It is, for example, a dispersion of the values obtained by subtracting the detected signal value in the dark state from the detected signal value in the bright state of each detecting element, or more simply, can be a dispersion value of the detected signals in the bright state. It should be noted that the process of obtaining the dispersion value may be implemented only at the time of determining said "specified frequency", and may not be carried out every time the defect is discriminated.

In the first defect discriminating method according to the present invention, it is desirable to use the value of the detection signal providing the maximum frequency (including the vicinity thereof) of the histogram or the average value of the detection signals as the representative value of the detection signals outputted from said detecting elements which are considered to be normal. (It is the same for the below-described second defect discriminating method.)

In this case, "The value of a detection signal at which the frequency in the histogram first comes down to or below a specified frequency, starting from the frequency of the representative value" means at least either of the value at which the frequency first comes down to or below the predetermined specified frequency when the histogram frequency is viewed in the direction in which the value of the detection signal is decreased from the value of the detection signal which provides the frequency in the histogram corresponding to said representative value, and the value at which the frequency first comes down to or below the predetermined specified frequency when the histogram frequency is viewed in the direction in which the value of the detection signal is increased from the value of the detection signal which provides the maximum frequency in the histogram. In this case, it is preferable that the "specified frequency" be set in consideration of the variation in sensitivity of the detecting elements to provide defect discrimination values for which the variation in sensitivity is taken into account. Hereinbelow, the former (latter) value in the above statement is called the lower (upper) defect discrimination value in the first defect discrimination method.

"A detection signal beyond the defect discrimination value" means a detection signal under the lower defect discrimination value when the lower defect discrimination value is taken as the defect discrimination value, and a detection signal over the upper defect discrimination value when the upper defect discrimination value is taken as the defect discrimination value.

It is preferable that both lower and upper defect discrimination values be used as the defect discrimination values, and in this case, "a detection signal beyond the defect discrimination value" refers, of course, to either a detection signal under the lower defect discrimination value or a detection signal over the upper defect discrimination value.

The second defect discriminating method according to the present invention is a defect discriminating method which discriminates a defective element of a solid-state detector with which a number of detecting elements to detect visible light or radiation are arranged, in which a histogram of each detection signal outputted from the detecting elements in the dark state and/or a histogram of each detection signal outputted from the detecting elements in the bright state in which a definite quantity of light or radiation is projected on the detecting elements without being passed through a subject are/is acquired, a value of the detection signals outputted from said detecting elements which are considered to be normal is determined, a value obtained by multiplying a specified factor by or adding or subtracting a specified value to/from the representative value is taken as the defect discrimination value, and a detecting element among the detecting elements which outputs a detection signal beyond the defect discrimination value is discriminated as a defective element.

Here, "a specified factor" is a value over 1 or under 1.

For this second defect discriminating method, it is preferable that the "specified factor" or "specified value" be set according to the index indicating the sensitivity of the detecting elements to provide defect discrimination values for which the variation in sensitivity of the detecting elements is taken into account. Hereinbelow, the defect discrimination value smaller (greater) than the value of the detection signal providing the maximum frequency is called the lower (upper) defect discrimination value in the second defect discrimination method.

Also with this second defect discriminating method, "a detection signal beyond the defect discrimination value" means a detection signal under the lower defect discrimination value when the lower defect discrimination value is taken as the defect discrimination value, and a detection signal over the upper defect discrimination value when the upper defect discrimination value is taken as the defect discrimination value. Further, it is preferable that both lower and upper defect discrimination values be used as the defect discrimination values, and in this case, "a detection signal beyond the defect discrimination value" refers, of course, to either a detection signal under the lower defect discrimination value or a detection signal over the upper defect discrimination value. The first defect discriminating device according to the present invention is a device which realizes the first defect hi discriminating method, i.e., a defect discriminating device which discriminates a defective element of a solid-state detector with which a number of detecting elements to detect visible light or radiation are arranged, comprising: histogram acquisition means for acquiring a histogram of each detection signal outputted from the detecting elements in the dark state and/or a histogram of each detection signal outputted from the detecting elements in the bright state in which a definite quantity of light or radiation is projected on the detecting elements without being passed through a subject, defect discrimination value determination means for determining a representative value of the detection signals outputted from said detecting elements which are considered to be normal, and taking, as the defect discrimination value, the value of a detection signal among said detection signals at which the frequency in said histogram first comes down to or below a specified frequency, starting from the frequency of said representative value, and discriminator means for discriminating, as a defective element, a detecting element among the detecting elements which outputs a detection signal beyond the defect discrimination value.

The defect discrimination value determination means of the first defect discriminating device is preferred to determine the specified value according to an index indicating the sensitivity of the detecting elements.

The second defect discriminating device according to the present invention is a device which realizes the second defect discriminating method, i.e., a defect discriminating device which discriminates a defective element of a solid-state detector with which a number of detecting elements to detect visible light or radiation are arranged, comprising: histogram acquisition means for acquiring a histogram of each detection signal outputted from the detecting elements in the dark state and/or a histogram of each detection signal outputted from the detecting elements in the bright state in which a definite quantity of light or radiation is projected onto the detecting elements without being passed through a subject, defect discrimination value determination means for determining a representative value of the detection signals outputted from said detecting elements which are considered to be normal, and taking, as the defect discrimination value, a value obtained by multiplying a specified factor by or adding or subtracting a specified value to/from the value of said detection signal at which the maximum frequency is provided, and discriminator means for discriminating, as a defective element, a detecting element among the detecting elements which outputs a detection signal beyond the defect discrimination value.

For this second defect discriminating device, it is preferable that the "specified factor" or "specified value" be set in consideration of an index indicating the sensitivity of the detecting elements.

In the first and second defect discriminating devices, said defect discrimination value determination means is preferred to use the value of the detection signal providing the maximum frequency of said histogram or the average value of the detection signals as said representative value of the detection signals outputted from said detecting elements which are considered to be normal.

With the first defect discriminating method and device according to the present invention, a histogram of each detection signal in the dark state and/or that of each detection signal in the bright state are/is acquired, a representative value of the detection signals outputted from said detecting elements which are considered to be normal (for example, a value of the detection signal providing the maximum frequency, or the average value of the detection signals) is determined, and the value of a detection signal among said detection signals at which the frequency in said histogram first comes down to or below a specified frequency, starting from the frequency of said representative value, is taken as the defect discrimination value, and any detecting element outputting a detection signal beyond this defect discrimination value is discriminated as a defective element. Therefore, by executing simple arithmetic processing to acquire a histogram, a defect can be discriminated, and thus the first method and device are well suited for automatic discrimination of defects. In addition, if the detection signal his related to the pixel position in processing, the pixel position of a defective element can be identified.

In addition, the discrimination is made by acquiring a histogram, so it is therefore not affected by the quantity of light or other factor, which means that if the quantity of light or other factor is varied in the bright state, the defect can be accurately discriminated.

In addition, if the specified frequency is set at zero, only the abnormal values due to the defective elements which are outside of the normal distribution can be exactly extracted regardless of the variation in sensitivity of the detecting elements, and the normal pixels will not be discriminated as defective pixels.

In addition, if the specified frequency is set according to the index indicating the sensitivity of the detecting elements, the defect can be discriminated in consideration of the variation in sensitivity of the detecting elements, and for example, the elements having an abnormal sensitivity can be discriminated as defective elements.

On the other hand, with the second defect discriminating method and device according to the present invention, a histogram of each detection signal in the dark state and/or that of each detection signal in the bright state are/is acquired, representative value of the detection signals outputted from said detecting elements which are considered to be normal is determined, the value obtained by multiplying a specified factor by or adding or subtracting a specified value to/from said representative value is taken as the defect discrimination value, and any detecting element outputting a detection signal beyond this defect discrimination value is discriminated as a defective element. Therefore, as is the case with the first method and device, by executing simple arithmetic processing, a defect can be discriminated, which makes the second method and device well suited for automatic discrimination of defects, and allows the pixel position of a defective element to be identified.

In addition, as is the case with the first defect discriminating method and device, the discrimination is made by acquiring a histogram, and so it is not affected by the quantity of light or other factor, which means that if the quantity of light or other factor is varied in the bright state, the defect can be accurately discriminated.

In addition, if the specified factor or value is set with the index indicating the sensitivity of the detecting elements, the defect can be discriminated in consideration of the variation in sensitivity of the detecting elements as in the first defect discriminating method and device, and the elements having an abnormal sensitivity can be discriminated as defective elements.

The above-stated methods and devices are applicable not only to the above-stated three modes of radiation solid-state detector, but also to any solid-state detector which mainly consists of semiconductors, and is configured by arranging a number of elements which detect visible light or radiation. For example, they are also applicable to other modes of radiation solid-state detector which detect radiation and output an image signal, solid-state image sensors such as a CCD image sensor which detects visible light and outputs an image signal, etc. This solid-state detector may be either one-dimensional or two-dimensional.

SUMMARY OF THE INVENTION

The purpose of the present invention is to offer a defective element discriminating method and device which can conveniently and properly discriminate defects of a detecting element.

BRIEF DESCRIPTION OF THE DRAWINGS

FIG. 2 is a diagram illustrating the corresponding relationship between the pixel position of a radiation solid-state detector and the image signal.

DESCRIPTION OF THE PREFERRED EMBODIMENTS

Hereinbelow, a defect discriminating method according to the present invention and a first embodiment of a defect discriminating device which realizes the method will be described with reference to the drawings.

Figure 1:
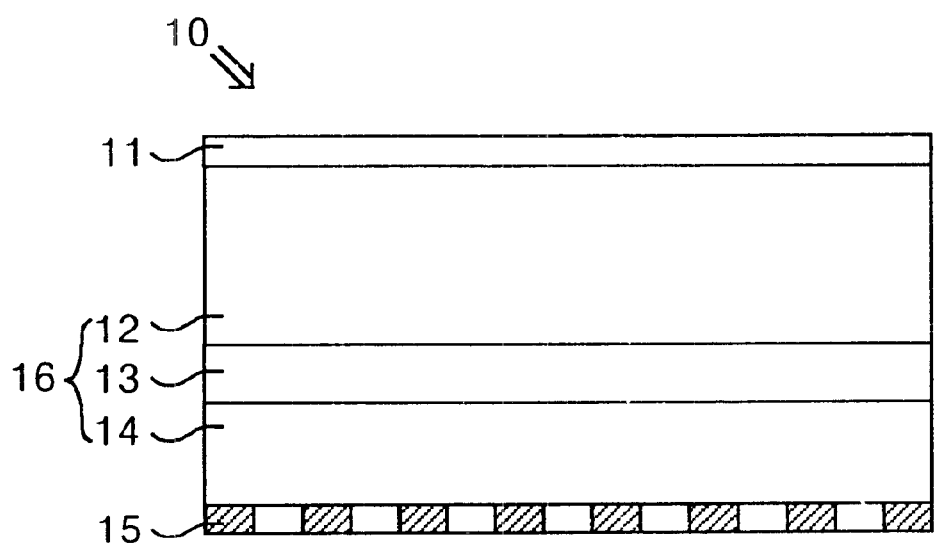
FIG. 1 is a sectional drawing illustrating a schematic configuration of a radiation solid-state detector applied to a defect discriminating device according to an embodiment of the present invention.

FIG. 1 is a sectional drawing illustrating a schematic configuration of a radiation solid-state detector applied to a defect discriminating device according to the embodiment of the present invention.

This radiation solid-state detector 10 is of the above stated improved direct conversion type, and as shown in FIG. 1, a solid-state detecting element 16 mainly consists of a photoconductive layer for recording 12, a hole transporting layer 13, and a photoconductive layer for reading 14, a plurality of solid-state detecting elements 16 corresponding to the pixels being arranged practically in a matrix (N lines×M rows) to provide a two-dimensional solid-state radiation detector.

A reading side electrode 15 for this solid-state radiation detector 10 is provided as striped electrodes, and by scanning line light sources 19 extending in the direction approximately perpendicular to the longitudinal direction of the striped electrodes along the longitudinal direction of the striped electrodes, i.e., the reading side electrode 15, the latent image charges can be detected for each line.

FIG. 2 shows a diagram illustrating the corresponding relationship between the pixel position (p, i) of a particular detecting element in the radiation solid-state detector 10 and the image data D (p, i), which is a detection signal. "p" denotes the address number of a detecting element along the vertical direction, and "i" the address number of a detecting element along the horizontal direction.

Figure 3:
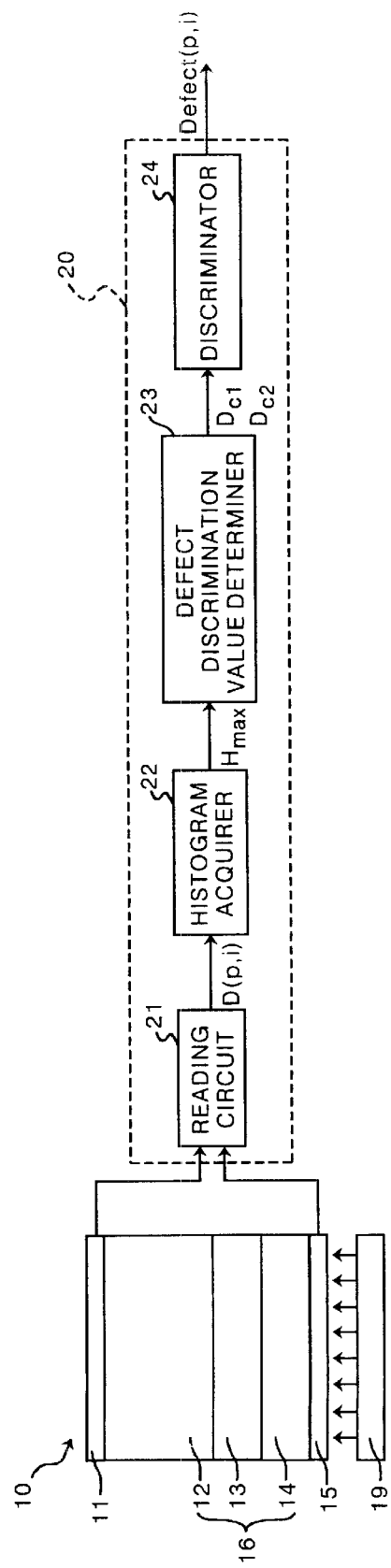
FIG. 3 is a block diagram illustrating a defect discriminating device according to an embodiment of the present invention together with a radiation solid-state detector.

FIG. 3 shows a block diagram illustrating a defect discriminating device 20 according to the present invention together with the radiation solid-state detector 10.

The defect discriminating device 20 is provided with a reading circuit 21, histogram acquisition means 22, defect discrimination value determiner means 23, and discriminator means 24.

The reading circuit 21 reads out the electrostatic latent image recorded in the radiation solid-state detector 10, and outputs image data D (p, i) for the detecting element of the pixel position (p, i) constituting the detector 10.

The histogram acquisition means 22 uses the image data outputted from all the detecting elements in the dark and bright states to acquire a histogram.

The defect discrimination value determiner means 23 uses the histogram acquired by the histogram acquisition means 22 to determine the defect discrimination value in accordance with a specified method (later described).

The discriminator means 24 discriminates, as a defective element, a detecting element which outputs image data D (p, i) out of the defect discrimination value determined by the defect discrimination value determiner means 23. This discriminator means 24 prepares a defect discrimination table Defect (p, i), and changes, from false to true, the value of the defect discrimination table Defect (p, i) corresponding to the pixel number of the element discriminated as a defective element. This defect discrimination table Defect (p, i) is used for defect correction in defect corrector means (not shown), etc.

Hereinbelow, the function of the defect discriminating device 20 will be explained.

First, the defect discrimination table Defect (p, i) is prepared so as to correspond to all of the detecting elements constituting the detector 10, and the Defect (p, i) is made false in all of them.

Figure 4A:
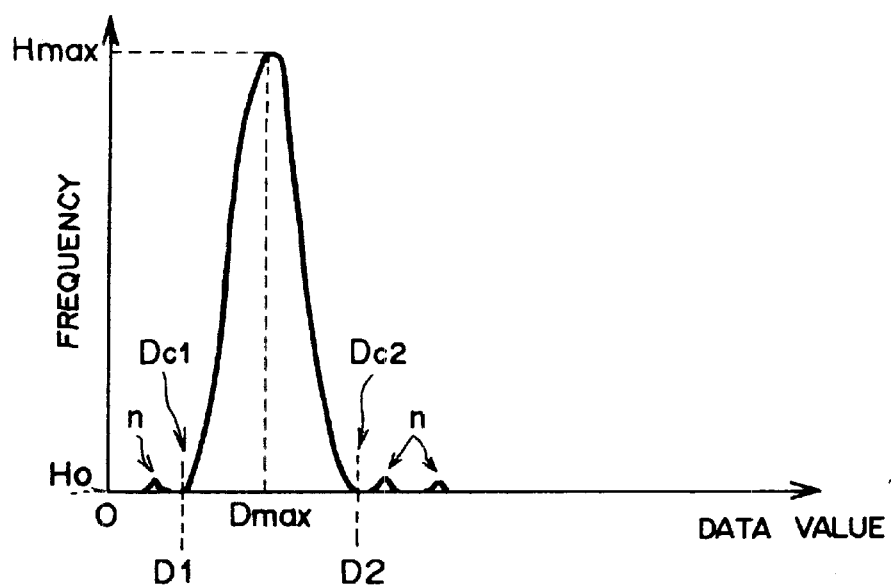
FIG. 4A and FIG. 4B are diagrams illustrating examples of a histogram prepared using histogram preparer means, in the dark state (FIG. 4A) and the bright state (FIG. 4B).

Then, the reader means 21 reads out the image data D (p, i) which is the detection signal of each detecting element in the dark state, i.e., the state in which visible light or radiation is either not projected at all. or a definite and extremely small quantity of visible light or radiation is projected on each detecting element without being passed through a subject, i.e., the image data D (p, I) which is the detection signal of each detecting element of the detector 10 recorded in the dark state. Then, the histogram acquisition means 22 acquires a histogram of all the image data. FIG. 4A shows an example of the histogram acquired.

Then, with respect to the data value Dmax at which the maximum frequency in the histogram, Hmax, is provided as the representative value of the detection signals outputted from said detecting elements which are considered to be normal, the defect discrimination value determiner means 23 determines the lower defect discrimination value $D_{c1}$ and the upper defect discrimination value $D_{c2}$ at which the frequency in the histogram first comes down to or below the specified frequency, starting from the maximum frequency Hmax. Specifically, both defect discrimination values $D_{c1}$, $D_{c2}$ are determined as follows (this example is called the first example).

The value D1 at which the frequency first comes down to or below the predetermined specified frequency H0 when the histogram frequency is viewed in the direction in which the data value is decreased from the data value Dmax among the image data D (p, i), which provides the maximum frequency Hmax, and the value D2 at which the frequency first comes down to or below the predetermined specified frequency H0 when the histogram frequency is viewed in the direction in which the data value is increased from the data value Dmax are determined, and D1 and D2 are used as the lower defect discrimination value $D_{c1}$ and the upper defect discrimination value $D_{c2}$, respectively.

Here, the data values outputted from the defective elements are generally abnormal values beyond the range of variation of data value due to the variation in sensitivity of the elements, and in the histogram, these abnormal values are distributed apart from the region of the distribution produced by the image data from the normal elements. For example, as shown in FIG. 4A, areas where the frequency of distribution on the normal pixels is temporarily reduced to zero are produced, and the abnormal values are developed in the areas as shown with an arrow. Therefore, to strictly separate the data values outputted from the defective elements from those outputted from the normal elements, the "specified frequency H0" must be zero.

Then, the discriminator means 24 takes the data ranges beyond the defect discriminating values $D_{c1}$, $D_{c2}$, i.e., the ranges under the lower defect discrimination value $D_{c1}$, and over the upper defect discrimination value $D_{c2}$ as the defective ranges, and discriminates all the detecting elements outputting a data value in such defective range as defective elements among the detecting elements in the dark state. Also, the defect discrimination table Defect (p, i) corresponding to the address positions of the elements discriminated as defective elements is made true. Such processing is carried out for all the addresses of the elements discriminated as defective elements to complete the defect discrimination table Defect (p, i) in the dark state.

When the trend of the data values on the defects is previously known, for example, when whether the data values on the defects are under the lower defect discrimination value $D_{c1}$ or over the upper defect discrimination value $D_{c2}$ is previously known, the above discrimination may be made on the basis of only one of two defect discrimination values $D_{c1}$, $D_{c2}$.

In the above example, the specified frequency H0 is zero, but the value of H0 may, of course, be other than zero. In such a case, it is preferable that the value of H0 be set in consideration of the index indicating the sensitivity of the detecting elements to provide defect discrimination values for which the variation in sensitivity is taken into account.

Figure 4B:
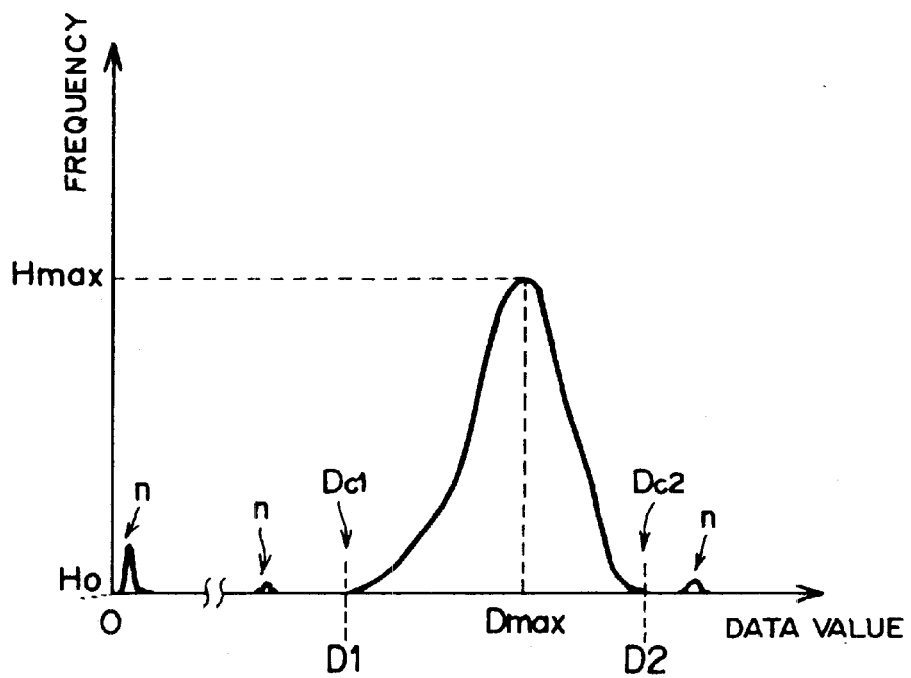

Then, the image data D (p, i) in the bright state, i.e., the state in which visible light or radiation of a definite quantity greater than that in the dark state is projected onto each detecting element without being passed through a subject is read out to acquire a histogram of the image data D (p, i) in the bright state. FIG. 4B shows an example of the histogram acquired. In FIG. 4B, the same factors as those as given in FIG. 4A, such as the maximum frequency, are provided with the same symbol as given in FIG. 4A, respectively.

Then, as with the above-stated processing in the dark state, discrimination of the defective elements in the bright state is performed, and the defect discrimination table Defect (p, i) corresponding to the address positions of the defective elements is made true. Such processing is carried out for all the addresses of the elements discriminated as defective elements to complete the defect discrimination table Defect (p, i) including the results of the discrimination in the bright state.

By making discrimination only with the dark state, the dead elements or the elements having an abnormal sensitivity (being abnormal in gain or other) cannot be removed, and by making discrimination only with the bright state, the elements which always output a definite data value cannot be removed. However, by discriminating the defective elements in both the dark state and the bright state as stated above, the defective elements can be thoroughly extracted. With only one of the dark and bright states, the above-stated problem occurs, but when it can be tolerated, discrimination with only one of the dark and bright states may, of course, be provided.

The defect corrector means (not shown) performs defect correction by using the specified method to correct the image data D (p, i) of the pixel number corresponding to an address having a correct defect discrimination table Defect (p, i). For example, a method is used which takes, as the correction value, the average of the data values of the surrounding pixels the defect discrimination table Defect (p, i) for which is false.

Next, a second example of a method for determining the defect discrimination values $D_{c1}$, $D_{c2}$ will be explained.

With the above-stated first example, the data values at which the frequency in the histogram first comes down to or below the specified frequency, starting from the maximum frequency Hmax are taken as the defect discrimination values, in other words, the data values providing the frequency in the histogram which is in a specified relationship to the maximum frequency Hmax are taken as the defect discrimination values. Contrary to this, the method for determining the defect discrimination values in this example takes the data values which are in a specified relationship to the data value Dmax at which the maximum frequency Hmax in the histogram is provided. As the method for determining the defect discrimination values in this case, various techniques are available. Some of them will be specifically explained hereinbelow. A technique other than those explained hereinbelow may, of course, be used.

A first technique is to take, as the defect discrimination values, the values obtained by multiplying the data value Dmax providing the maximum frequency Hmax in the histogram by the specified factors. As the specified factors, a value under 1, for example 0.8, is specified, the value obtained by multiplying the data value Dmax by 0.8 being taken as the lower defect discrimination value $D_1$, and a value over 1, for example 1.2, is specified, the value obtained by multiplying the data value Dmax by 1.2 being taken as the upper defect discrimination value $D_{c2}$. In other words, the values having a deviation of ±20% of the data value Dmax are taken as the defect discrimination values.

A second technique is to take, as the defect discrimination values, the values obtained by subtracting or adding the specified factors from/to the data value Dmax providing the maximum frequency Hmax in the histogram. For example, the value obtained by subtracting the specified value α from the data value Dmax is taken as the lower defect discrimination value $D_{c1}$, and the value obtained by adding the specified value α to the data value Dmax is taken as the upper defect discrimination value $D_{c2}$.

In setting the "specified factor" or "specified value" as mentioned in the above description, it is preferable that the "specified factor" or "specified value" be set in consideration of the index indicating the sensitivity of the detecting elements to provide defect discrimination values for which the variation in sensitivity is taken into account. For example, it is recommended to adopt the following procedure for the second technique.

First, in each of the dark and bright states, a histogram is acquired as stated above.

Next, the difference Δ between the data value DLmax, which provides the maximum frequency HLmax in the histogram in the bright state, and the data value DDmax, which provides the maximum frequency HDmax in the histogram in the dark state, is multiplied by the value α predetermined in consideration of the variation in sensitivity to obtain the value αΔ. Then, the value αΔ is subtracted from the data value DLmax, the result of (DLmax−αΔ) being taken as the lower defect discrimination value $D_{c1}$, and the value αΔ is added to the data value DLmax, the result of (DLmax+αΔ) being taken as the upper defect discrimination value $D_{c2}$. Needless to say, the value α determined in consideration of the index indicating the sensitivity defines the breadth of the variation insensitivity.

The two defect discrimination values $D_{c1}$, $D_{c2}$ obtained by this second technique are generally different from the two defect discrimination values $D_{c1}$, $D_{c2}$ obtained by the above-stated first technique. Then, by combining these two technique with each other to determine the defect discrimination values, more accurate discrimination can be provided. Especially in determining the defect discrimination values in the bright state, the combined technique is effective.

For example, the data breadth $\alpha\Delta = D_{c2} - D_{c1}$, which is determined by both defect discrimination values $D_{c1}$, $D_{c2}$ obtained by the above-stated first technique is compared with the data breadth $\Delta 2 = D_{c2} - D_{c1}$, which is determined by both defect discrimination values $D_{c1}$, $D_{c2}$ obtained by the above-stated second technique which takes the variation insensitivity into account, and the values providing a narrower breadth are taken as the defect discrimination values. The ranges beyond these defect discrimination values are specified as the defect ranges, and any detecting elements outputting image data in these defect ranges can be discriminated as defective elements in the bright state.

As stated above, according to the present invention, a histogram of each detection signal in the dark state and/or that of each detection signal in the bright state are/is acquired, and by using the histogram, the defect discrimination values are determined, any detecting elements outputting detection signals beyond these defect discrimination values being discriminated as defective elements. Therefore, by executing a simple arithmetic processing to acquire a histogram, a defect can be discriminated, which makes the method and device according to the present invention well suited for automatic discrimination of defects, and allows the pixel position of a defective element to be identified.

In addition, if the index indicating the sensitivity of the detecting elements is considered in setting the specified frequency or the specified factor or value, more accurate discrimination can be made.

Further, although in the above-described embodiments the defect discrimination value determiner means 23 has been described to use the data value Dmax at which the maximum frequency in the histogram, Hmax, as the representative value of the detection signals outputted from said detecting elements which are considered to be normal, it is not limited thereto, but it may use an average value of the image data D(p,i) of the detecting elements as the representative value.

What is claimed is:

1. A defect discriminating method which discriminates a defective element of a solid-state detector in which a number of detecting elements to detect visible light or radiation are arranged, forming at least one of: a first histogram based on first detection signals outputted from said detecting elements in a dark state and a second histogram based on second detection signals outputted from said detecting elements in a bright state, determining a representative value of said at least one of said first detection signals and said second detection signals, determining a value of said at least one of said first detection signals and said second detection signals which corresponds to a specified frequency of said at least one of said first histogram and second histogram and is the closest to said representative value as a defect discrimination value, and detecting elements among said detecting elements which outputs a detection signal beyond said defect discrimination value as a defective element.

2. The defect discriminating method as defined in claim 1, wherein said specified frequency is determined according to an index which indicates sensitivity of said detecting elements.

3. A defect discriminating method which discriminates a defective element of a solid-state detector in which a number of detecting elements to detect visible light or radiation are arranged, forming at least one of: a first histogram based on first detection signals outputted from said detecting elements in a dark state and a second histogram based on second detection signals outputted from said detecting elements in a bright state, determining a representative value of at least one of: said first detection signals and said second detection signals, determining a defect discrimination value by multiplying a specified factor by or adding or subtracting a specified value to/from said representative value, and detecting elements among said detecting elements which outputs a detection signal beyond said defect discrimination value as a defective element.

4. The defect discriminating method according to claim 3, wherein said specified factor and said specified value are determined according to an index indicating sensitivity of said detecting elements.

5. The defect discriminating method according to any one of claims 1 to 4, wherein a value of a detection signal providing a maximum frequency of said at least one of first histogram and said second histogram is used as said representative value.

6. The defect discriminating method according to any one of claims 1 to 3, wherein an average value of said first detection signals and said second detection signal, is used as said representative value.

7. A defect discriminating device which discriminates a defective element of a solid-state detector in which a number of detecting elements to detect visible light or radiation are arranged, comprising:

histogram acquisition means for acquiring a histogram based on detection signals outputted from said detecting elements in at least one of: a the dark state and a bright state wherein a definite quantity of light or radiation is projected onto said detecting elements;

defect discrimination value determination means for determining a representative value of said detection signals outputted from said detecting elements which are considered to be normal, and taking, as a defect discrimination value a value of a detection signal among said detection signals which corresponds to a specified frequency in said histogram and is the closest to said representative value; and discrimination means for discriminating at least one of said detecting elements which outputs a detection signal beyond said defect discrimination value.

8. The defect discriminating device as defined in claim 7, wherein said defect discrimination value determination means determines said specified frequency according to an index which indicates sensitivity of said detecting elements.

9. A defect discriminating device which discriminates a defective element of a solid-state detector in which a number of detecting elements to detect visible light or radiation are arranged, comprising:

histogram acquisition means for acquiring a histogram based on detection signals outputted from said detecting elements in at least one of: the dark state a bright state wherein a definite quantity of light or radiation is projected onto said detecting elements;

defect discrimination value determination means for determining a representative value of the detection signals outputted from said detecting elements which are considered to be normal, and a defect discrimination value by multiplying a specified factor by or adding or subtracting a specified value to/from said representative value, and discrimination means for discriminating one of said defective elements which outputs a detection signal beyond said defect discrimination value.

10. The defect discriminating device as defined in claim 9, wherein said defect discrimination value determination means determines said specified factor and said specified value according to an index indicating sensitivity of the detecting elements.

11. The defect discriminating device as defined in any one of claims 7 to 10, wherein said defect discrimination value determination means uses a value of a detection signal providing a maximum frequency of said histogram as said representative value.

12. The defect discriminating device as defined in any one of claims 7 to 10, wherein said defect discrimination value determination means uses an average value of said detection signals as said representative value.

13. A defect discriminating method for discriminating a defective element of a solid-state detector in which a number of detecting elements to detect visible light or radiation are arranged, said defect discriminating method comprising:

acquiring a histogram from detection signals outputted from said detecting elements;

providing a representative value of said detection signals from said histogram;

determining defect discrimination values based on said representative value;

discriminating one of said detecting elements which outputs a detection signal beyond said defect discrimination value.

14. The defect discriminating method according to claim 13, wherein a value corresponding to maximum frequency of occurrence in said histogram is used as said representative value.

15. The defect discriminating method according to claim 13, wherein an average value of the detection signals outputted from said detecting elements is used as the representative value.

16. The defect discriminating method according to claim 15, wherein the average value is determined when the detecting elements are in a dark state.

17. The defect discriminating method according to claim 15, wherein the average value is determined when the detecting elements are in a bright state.

18. The defect discriminating method according to claim 13, wherein the histogram indicates a distribution of detected outputs for each detector element of an array of detection elements.

19. The defect discriminating method according to claim 13, wherein the defect discrimination value corresponds to a value in the histogram distribution of a predetermined frequency and which is closest to the representative value.

20. The defect discrimination method according to claim 19, wherein the predetermined frequency is zero.

* * * * *